(12) United States Patent
Rohm et al.

(10) Patent No.: US 6,459,752 B1
(45) Date of Patent: Oct. 1, 2002

(54) CONFIGURATION AND METHOD FOR DETERMINING WHETHER THE COUNTER READING OF A COUNTER HAS REACHED A PREDETERMINED VALUE OR NOT

(75) Inventors: Peter Rohm, Pfaffenhofen; Patrick Leteinturier, München, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/946,988

(22) Filed: Sep. 4, 2001

Related U.S. Application Data

(63) Continuation of application No. PCT/DE00/00593, filed on Mar. 1, 2000.

(51) Int. Cl.$^7$ ............................................... G06M 3/00
(52) U.S. Cl. ............................. 377/28; 377/30; 377/114
(58) Field of Search ............................. 377/30, 114, 28

(56) References Cited

U.S. PATENT DOCUMENTS 5,666,329 A    9/1997   Buro et al. ..................... 368/5
6,266,625 B1 * 7/2001   Johnson ......................... 702/89

* cited by examiner

*Primary Examiner*—Margaret R. Wambach
(74) *Attorney, Agent, or Firm*—Laurence A. Greenberg; Werner H. Stemer; Gregory L. Mayback (57) ABSTRACT

A system and a method are characterized in that the method of detection can be configured by varying a size and/or a position of a time slot to be taken into consideration for the detection and/or by varying relevant bits of the counts to be compared. This makes it possible to individually adapt the detection method to various or varying requirements at any time and with a minimum of expenditure required.

23 Claims, 7 Drawing Sheets

CONFIGURATION AND METHOD FOR DETERMINING WHETHER THE COUNTER READING OF A COUNTER HAS REACHED A PREDETERMINED VALUE OR NOT

CROSS-REFERENCE TO RELATED APPLICATION

This application is a continuation of copending International Application No. PCT/DE00/00593, filed Mar. 1, 2000, which designated the United States.

BACKGROUND OF THE INVENTION

Field of the Invention

The present invention relates to a device and a method for determining whether a counter reading of a counter has reached a predetermined value or not.

In order to determine whether the counter reading of the counter has reached a predetermined value, use is normally made of an equal to comparator, by which the counter readings of the counter are each compared with the predetermined value.

Reaching a specific counter reading is, in control and regulating equipment, often the triggering event for the generation of a pulse or an edge. Control and regulating equipment of this type has been known for many years in innumerable embodiments and does not require any more detailed explanation.

However, experience shows that event-controlled pulse or edge generating systems of this type can either be adapted exactly to the individual requirements only with a relatively great effort, or cannot be adapted at all, or in any case not under all circumstances.

SUMMARY OF THE INVENTION

It is accordingly an object of the invention to provide a configuration and a method for determining whether the counter reading of a counter has reached a predetermined value or not which overcomes the above-mentioned disadvantages of the prior art devices of this general type, which permit the generation of a pulse or edge which at any time can be adapted individually to various needs.

With the foregoing and other objects in view there is provided, in accordance with the invention, a configuration for determining whether a counter reading of a counter has reached a predetermined counter reading. The configuration contains a means for determining whether the predetermined counter reading has already been reached within a specific time window or not. The means can be configured by varying a magnitude of the specific time window, a position of the specific time window, and/or a quantity of bits to be taken into account in a determination of counter readings to be compared.

Accordingly, the configuration according to the invention and the method according to the invention are distinguished by the fact that the determination or the configuration carrying out the determination can be configured by varying the magnitude and/or position of a time window to be taken into account in the determination and/or by varying the bits to be taken into account in the determination from the counter readings to be compared.

As a result of such configurability of the determination or of the configuration carrying this out, they can be adapted extremely simply and flexibly at any time to the widest range of needs. The configurations and methods for determining whether the counter reading of a counter has reached a predetermined value or not, which hitherto could not be adapted individually at all, or only to a restricted extent, have as a result become configurations and methods which can be used universally and can also be adapted immediately to changing needs.

In accordance with an added feature of the invention, the specific time window is defined relative to the predetermined counter reading. More precisely, the specific time window is defined by a first range lying before the predetermined counter reading and by a second range lying after the predetermined counter reading.

In accordance with an additional feature of the invention, the means contains at least one memory device with a variable content for storing parameters defining the position and the magnitude of the specific time window. The means also includes a memory device with a variable content for storing the predetermined counter reading. Of course the memory devices can be the same memory unit.

In accordance with a further feature of the invention, the means generates a determination result represented by a value based on a comparison of a difference between a current counter reading of the counter and the predetermined counter reading, and on further processing of the difference in dependence on the difference itself and on the specific time window.

In accordance with a another feature of the invention, the further processing of the difference consists in that, for the case in which the difference is positive or equal to zero, the magnitude of the second range lying after the predetermined counter reading is subtracted from the difference. And for the case in which the difference is negative, the magnitude of the first range lying in front of the predetermined counter reading is added to the difference.

In accordance with a further added feature of the invention, the bits to be taken into account in the determination of comparable counter readings are a least significant bit and a variable number of next most significant bits of the counter readings to be compared. The counter readings to be compared are subtracted bit by bit, a generation of a respective difference bit being carried out without taking a carry bit into account, and a generation of a respective carry bit output being carried out with the carry bit being taken into account, the carry bit resulting from the subtraction of next least significant bits of the counter readings.

In accordance with a further additional feature of the invention, the difference bit formed with the carry bit being taken into account is generated for the bits of the counter readings which represent the least significant of the bits not to be taken into account from the counter readings.

In accordance with a concomitant feature of the invention, the difference bit formed with the carry bit being taken into account from the least significant of the bits not to be taken into account from the counter readings is used as the determination result.

With the foregoing and other objects in view there is provided, in accordance with the invention, a method for determining whether a counter reading of a counter has reached a predetermined value. The method includes the steps of determining whether a predetermined counter reading has already been reached within a specific time window; and configuring a determination by varying a magnitude of the specific time window, a position of the specific time window, and/or a number bits to be taken into account of counter readings to be compared during the determination.

Other features which are considered as characteristic for the invention are set forth in the appended claims.

Although the invention is illustrated and described herein as embodied in a configuration and a method for determining whether the counter reading of a counter has reached a predetermined value or not, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In all the figures of the drawing, sub-features and integral parts that correspond to one another bear the same reference symbol in each case.

The configurations considered in more detail below determine whether a counter reading of a counter has reached a predetermined value within a time window to be taken into account or not.

The configuration is preferably provided in the counter whose counter reading is to be compared with the predetermined counter reading, or in the immediate vicinity of the same. As a result, in a simple way and with little effort, it is possible for the comparison to be carried out in each case to be based on the current counter reading of the counter. Ideally, the counter reading of the counter, for example, does not have to be transferred via a bus to the configuration evaluating the reading. However, there is no restriction to such a positioning of the configuration. In principle, the configuration can be provided at any desired points.

The configurations described are distinguished by the fact that they can be configured by varying the magnitude and/or position of the time window to be taken into account in the determination and/or by varying the bits to be taken into account in the determination from the counter readings to be compared.

In order to configure the determination as to whether the counter reading of the counter has reached the predetermined value within the time window to be taken into account, two possibilities are presented below, which can optionally be used individually or in combination.

The common factor in the two variants is that, in the determination, only the time window whose magnitude at least can be varied is taken into account, and that it is not only determined whether the current counter reading of the counter agrees with the predetermined value, but also whether the counter reading of the counter has passed the predetermined counter reading within the part of the time window to be taken into account which has elapsed.

The first of the aforementioned variants will be described below with particular reference to FIGS. 3 to 5, and the second variant with particular reference to FIGS. 6 and 7.

In the first variant, in the determination as to whether the counter reading of the counter has reached the predetermined value or not, only the specific time window is taken into account, it being possible to vary both its magnitude and its position. In the example considered, the time window is defined relative to the predetermined counter reading that, in the following text, is referred to as the threshold value T (defined around the threshold). It should already be pointed out at this point that the time window to be taken into account can also be defined around any other desired reference points.

Figure 2A:
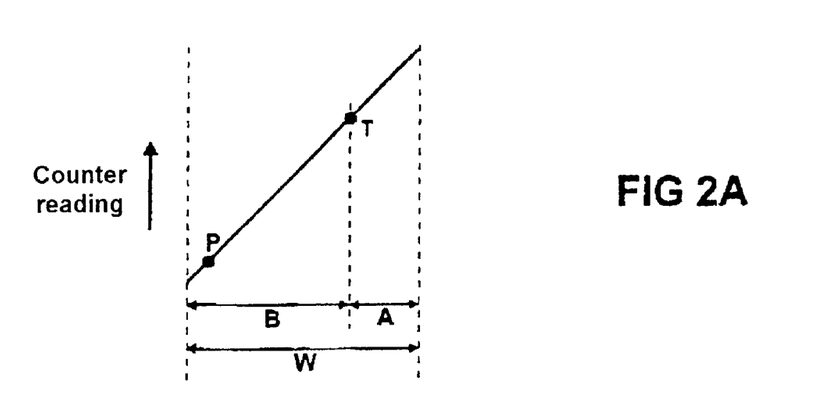
FIGS. 2A to 2C are graphical representations illustrating possible positions of a time window to be taken into account in the determination.

The time window to be taken into account is designated in the figures by the reference symbol W and, in the example considered, extends from the reaching of a counter reading $T-B$ to the reaching of a counter reading $T+A$ (see FIG. 2A).

If the counter counts repeatedly (periodically) from one counter reading m up to a counter reading M (see FIG. 1), then the following should be true: $M-m \geq A+B$. The values A and B can otherwise in principle be selected freely. In particular, it is not necessary for $T-B=m$ and/or $T+A=M$ to hold true (see FIGS. 2B and 2C).

Figure 3:
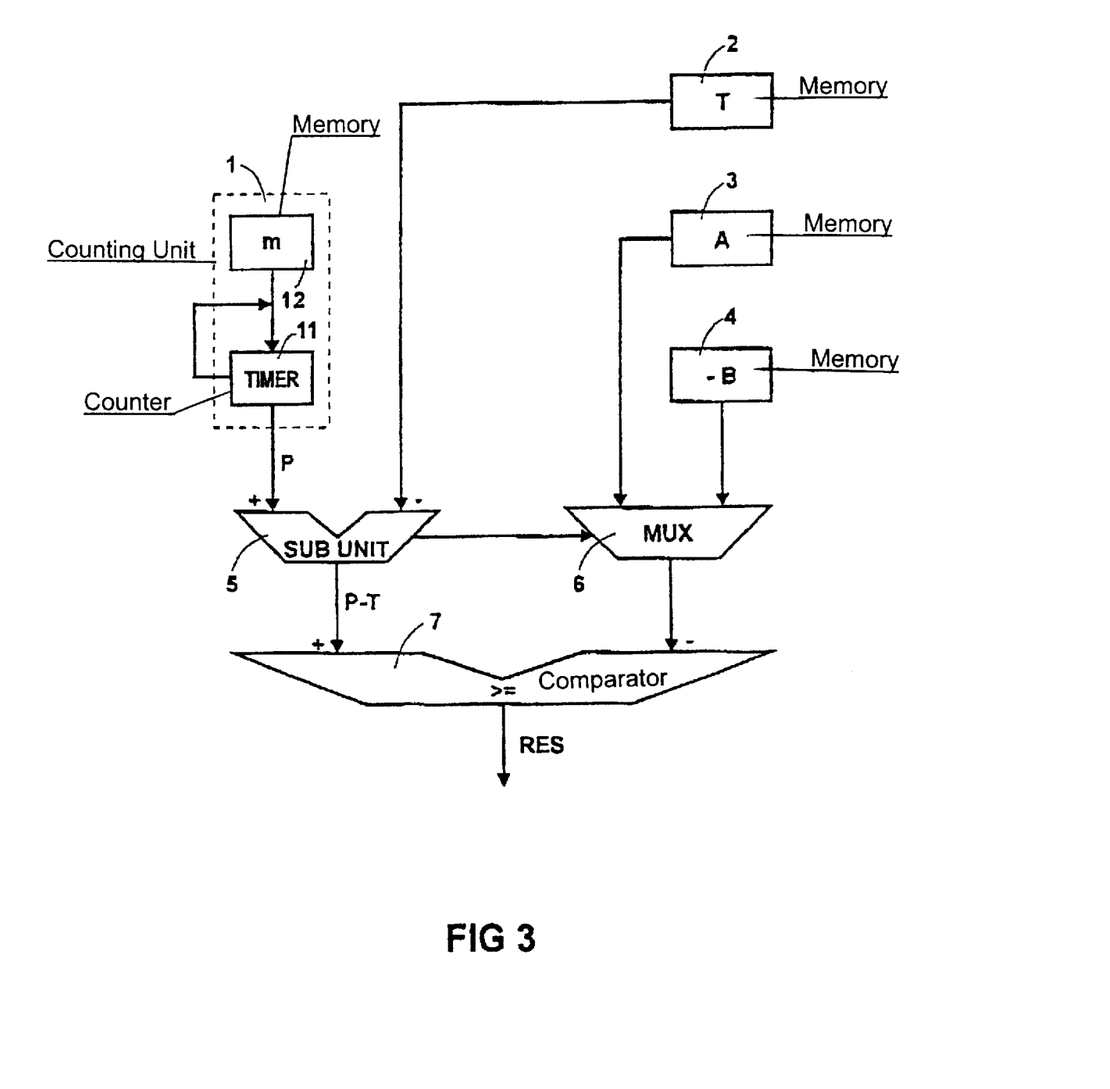
FIG. 3 is a block diagram of the configuration for determining whether the counter reading of the counter has already reached a predetermined value within a time window whose magnitude and/or position can be varied or not.

A configuration which permits the variation of the magnitude and position of the time window W to be taken into account, and which is capable of determining whether the counter reading of the counter has reached or passed the predetermined value (the threshold value T) within the time window to be taken into account or not, is shown in FIG. 3.

As can be seen from FIG. 3, the configuration contains a counting unit 1, memory devices 2, 3 and 4 for storing the threshold value T and the values A and B (more precisely, the value A and the negated value B) defining the magnitude and the position of the time window to be taken into account, a (full-value) subtractor 5, a multiplexer 6 and a greater than/equal to comparator 7. The counting unit 1 has a counter (timer) 11 and a memory device 12 for storing a counter reading (m) at which the counter 11 is to begin counting in each case.

Figure 1:
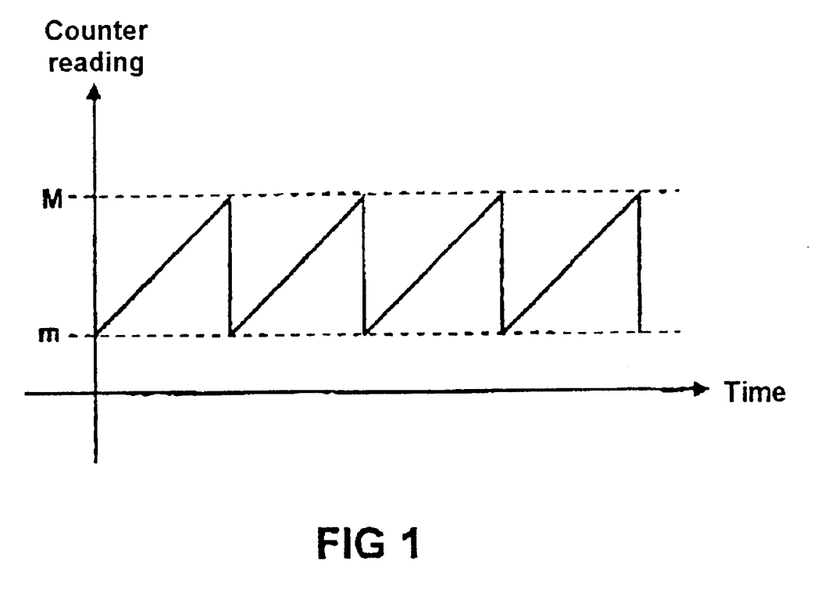
FIG. 1 is a graphical representation illustrating the counting behavior of a counter, for whose counter reading, by use of a configuration specifically considered here and the method specifically considered here, the intention is to make it possible to determine whether it has already reached a predetermined counter reading or not according to the invention.

The counter 11, more precisely its counter reading designated below by the reference symbol P, can be reset as required (for example during the counting of the counter 11 as shown in FIG. 1) to the value stored in the memory device 12.

The memory device 12 and the memory devices 2, 3 and 4 are preferably rewritable storage devices with a variable content.

The counter reading P of the counter 11 and the threshold value T stored in the memory device 2 are fed to the subtractor 5. The latter forms the difference P−T, outputs this to the greater than/equal to comparator 7 and controls the multiplexer 6 on the basis of the sign of the difference.

The multiplexer 6 is fed with the value A stored in the storage device 3 and the value −B stored in the storage device 4. The multiplexer 6, as has already been mentioned previously, is controlled by the subtractor 5, to be specific in such a way that the multiplexer 6 outputs the value A when the result of the subtraction P−T carried out by the subtractor 5 is greater than or equal to zero, and in such a way that the multiplexer 6 switches the value −B through when the difference P−T is less than zero. The signal switched through by the multiplexer 6 is applied as the second signal to the greater than/equal to comparator 7.

The greater than/equal to comparator 7 checks whether the value output by the subtractor 5 is greater than or equal to the value switched through by the multiplexer 6 or not and outputs a signal RES representing the comparison result.

The signal RES representing the comparison result is at the same time the signal representing a result of the determination to be carried out.

If the signal RES indicates that the value output by the subtractor 5 is greater than or equal to the value switched through by the multiplexer 6, then the counter reading P of the counter 11 has not yet reached or passed the threshold value T within the current time window. The state of the signal RES indicating this will be referred to below as "EVENT NOT OCCURRED". Otherwise, the counter reading P of the counter 11 has already reached or passed the threshold value T within the relevant time window; the state of the signal RES indicating this will be referred to below as "EVENT OCCURRED".

The function of the configuration according to FIG. 3 may be expressed mathematically as follows:

Delta=$P-T$   Step 1)

RES=Delta−$A$(for Delta$\geq 0$)

or

RES=Delta+$B$(for Delta<0)   Step 2)

RES indicates "EVENT OCCURRED" (for Delta<0)

or

RES indicates "EVENT NOT OCCURRED" (for Delta$\geq 0$).Step 3)

Figure 2B:
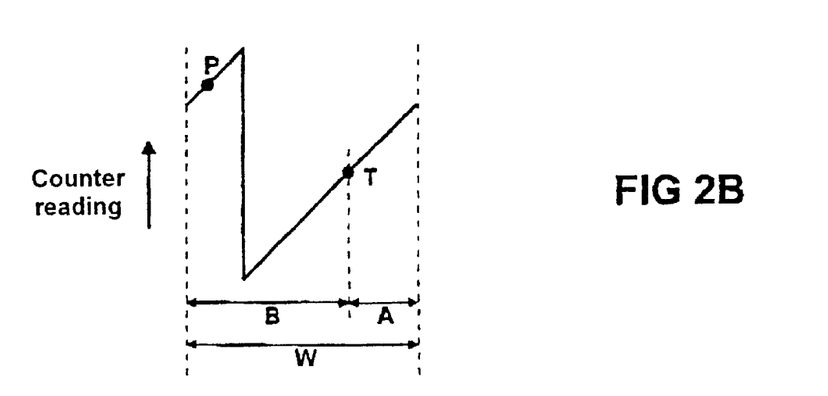
Figure 2C:
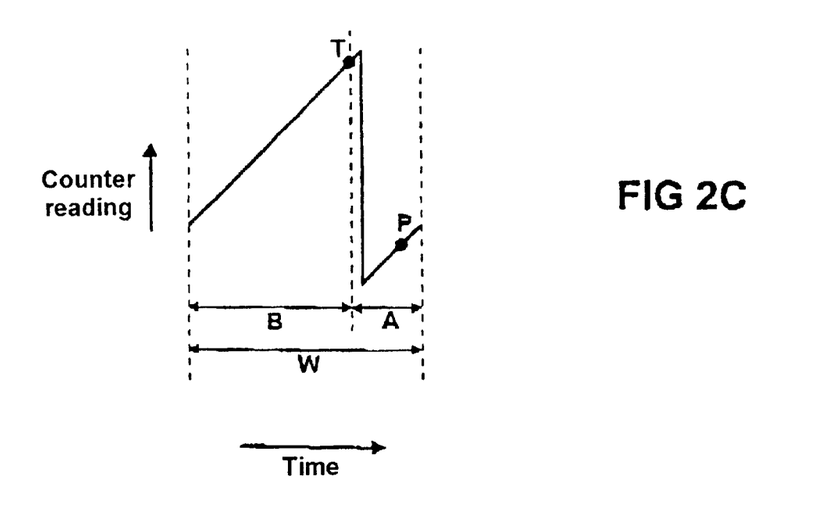

From this (more precisely, from Step 2), it can be seen that the determination as to whether the counter reading P of the counter 11 has reached or exceeded the threshold value T within the time window to be taken into account is carried out correctly even if—as illustrated in FIGS. 2B and 2C—the counter reading P of the counter 11 jumps back from M to m within the time window to be taken into account.

The fact that, by the configuration according to FIG. 3, it is determined not only whether the counter reading P of the counter 11 is equal to the threshold value T at the relevant time, but in addition it is checked whether the counter reading P of the counter 11 has passed the threshold value T within the time window to be taken into account, proves to be of advantage in particular in the case of changes to the threshold value T. As a result, in cases in which the threshold value T, after a change to the same, represents a counter reading which the counter reading P of the counter 11 has already passed within the instantaneous time window, the action which has to be carried out when the threshold value T is reached by the counter reading P of the counter 11 is not left out in the relevant time window, but is carried out immediately, that is to say, so to speak, is made up within the relevant time window.

In this case, it is possible to set, by use of the values A and B, the maximum time delay as compared with the normal case with which the action may still be carried out. An action to be carried out actually when the threshold value T is reached by the counter reading P of the counter 11, in the case of the configuration according to FIG. 3, will still be carried out up to A counting cycles after the threshold value T has been reached by the counter reading P of the counter 11; if the reaching of the threshold value T by the counter reading P of the counter is delayed by more than A counting cycles, then the action will only be carried out when the counter reading P of the counter 11 reaches the threshold value T on the next occasion.

In spite of its very simple construction, the configuration shown in FIG. 3 can be used very flexibly and, with minimum effort, can be adapted excellently at any time to individual and/or changing needs.

The configuration according to FIG. 3 may be simplified still further under certain preconditions.

Figure 4:
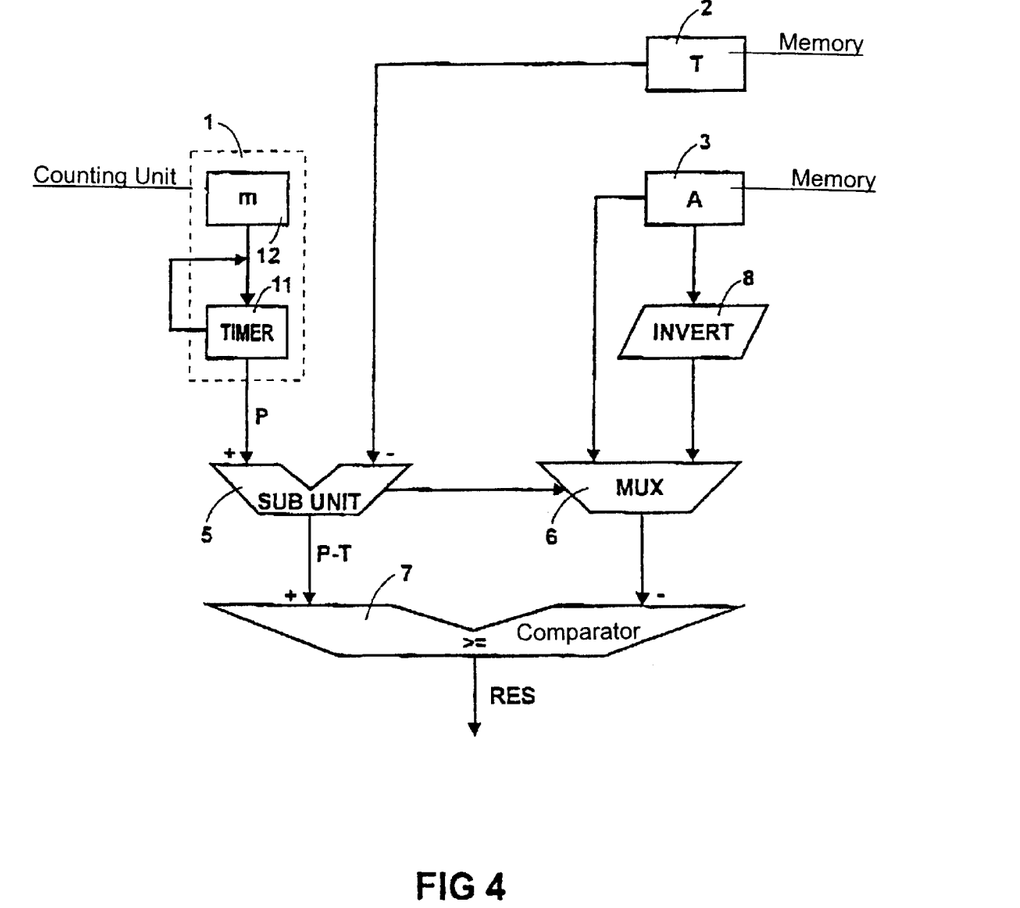
FIG. 4 is a block diagram of the configuration whose function and mode of operation for the case in which the magnitude of the part of the time window located before the predetermined counter reading is equal to the magnitude of the part of the time window located after the predetermined time reading and corresponds to the configuration according to FIG. 3.

For the case A=B, the configuration according to FIG. 3 can be replaced in equivalent fashion by the configuration shown in FIG. 4.

The configuration according to FIG. 4 does not contain any memory device 4 for storing the parameter −B. Instead, an inverter 8 is provided, which converts the content A of the storage device 3 into −B.

The result of the inversion (−B) is fed to the multiplexer 6. The multiplexer 6 of the configuration according to FIG. 4 is therefore fed with the same data for the case A=B as the multiplexer 6 in the configuration according to FIG. 3.

Otherwise, the configurations according to FIGS. 3 and 4 are the same.

Figure 5:
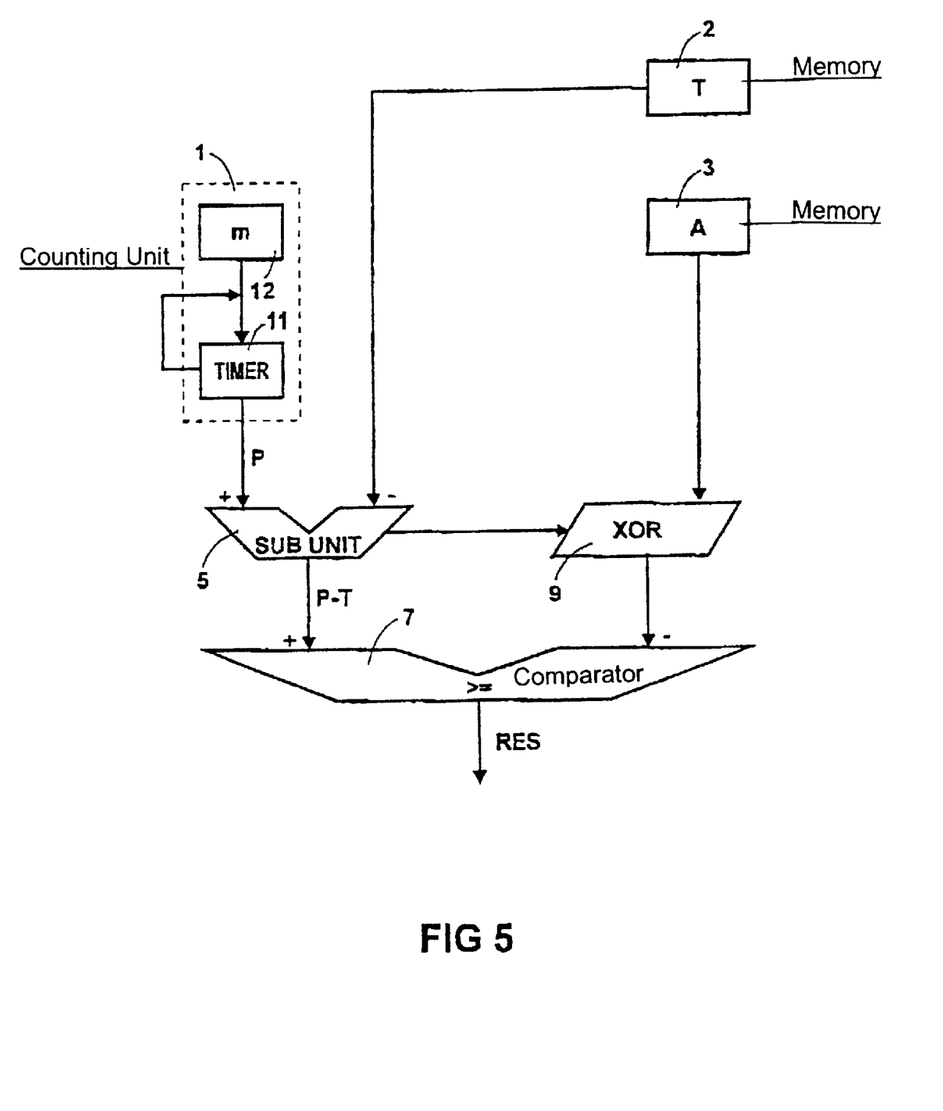
FIG. 5 is a block diagram of the configuration whose function and mode of operation for the case in which the magnitude of the part of the time window located before the predetermined counter reading is shorter by one counting cycle than the magnitude of the part of the time window located after the predetermined counter reading corresponds to the configuration according to FIG. 3.

For the case B=A−1, the configuration according to FIG. 3 can be replaced in equivalent manner by the configuration shown in FIG. 5.

The configuration according to FIG. 5 does not contain any memory device 4 for storing the parameter −B, nor any multiplexer 6. Instead, an XOR unit is provided, which subjects the content A of the memory device 3 (including the sign bit) to a bit by bit XOR operation with the signal output by the subtractor 5 to the XOR unit 9.

Assume that the output of the subtractor 5 to the XOR unit 9 (a bit representing the sign of the subtraction result) is equal to zero for subtraction results $\geq 0$, and is equal to 1 for subtraction results <0.

An XOR operation, in which a bit to be subjected to the XOR operation is equal to 0, has the value of the other bit as a result. For subtraction results $\geq 0$, the content of the memory device 3, that is to say A, is consequently the result of the XOR operation. Otherwise, the result is −(A−1), that is to say −B as the result of the XOR operation.

The result of the XOR operation is fed to the multiplexer 6. The multiplexer 6 in the configuration according to FIG.

5 is therefore fed with the same data for the case B=A−1 as the multiplexer 6 in the configuration according to FIG. 3.

Otherwise, the configurations according to FIGS. 3 and 5 are the same.

It should be obvious that the configuration according to FIG. 3 can be modified additionally or otherwise in terms of its function and mode of operation.

A description will now be given, with reference to FIGS. 6 and 7, of a second variant, already mentioned at the beginning, of a configurable configuration for determining whether the counter reading of the counter has reached the predetermined value or not.

In the second variant, only specific bits of the counter reading P of the counter and of the predetermined counter reading (of the threshold value T) are taken into account. The bits taken into account contain the lowest significant bit and a variable number of next most significant bits of the counter readings.

Figure 6:
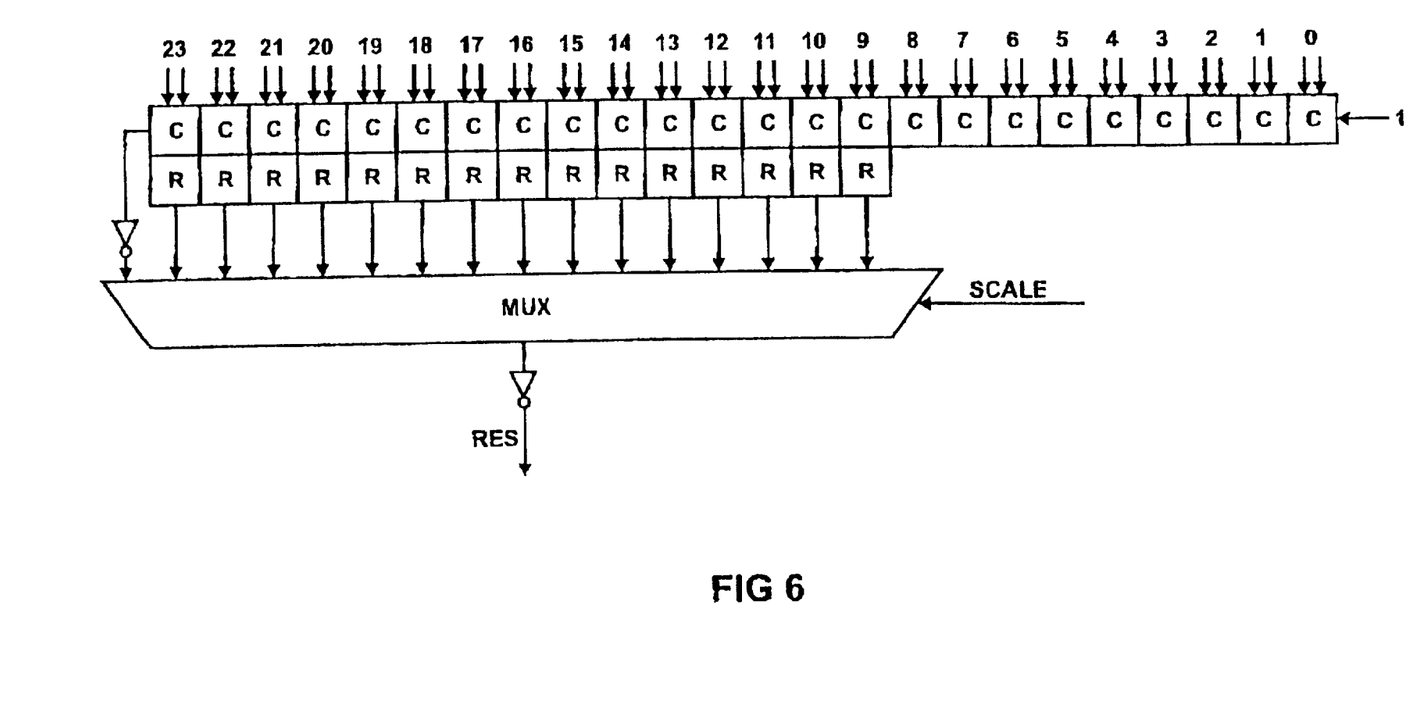
FIG. 6 is a block diagram of the configuration in which, during the determination as to whether the counter reading of the counter has reached the predetermined value or not, only selected bits of the counter readings are taken into account.

A configuration which permits variation of the bits to be taken into account from the mutually opposing counter readings and is capable of determining whether the part to be taken into account from the counter reading P of the counter has reached or passed the part to be taken into account from the predetermined counter reading (of the threshold value T) within the time window to be taken into account or not is shown in FIG. 6.

Before the detailed description of the configuration according to FIG. 6, it should be remarked that it is assumed there that the mutually opposing counter readings each containing 24 bits (bits 0 . . . 23), and that of the bits, during the determination to be carried out by the configuration, in each case only the bits 0 to n are taken into account, n being adjustable between 8 and 23 in the example considered.

As can be seen from FIG. 6, the configuration contains a large number of carry-bit generating blocks C, a large number of (determination) result generating blocks R, and a multiplexer MUX.

The carry-bit generating blocks C are present in a number which corresponds to the number of bits that in each case contain the mutually opposing counter readings. For each counter reading bit, one carry-bit generating block C is provided, and consequently in the example considered a total of 24 carry-bit generating blocks C are provided.

In the example considered, the result generating blocks R are present in a lower number. This is because the result generating blocks R have to be provided only for those bits of the counter readings which can be the next most significant bit after the most significant of the bits of the counter readings to be taken into account. In the example considered, these are the bits 9 to 23 of the counter readings; the result generating blocks R are provided only for these bits. The result generating blocks R are in each case connected downstream of the carry-bit generating block C assigned to the same bit (see FIG. 7).

As the designation already indicates, the carry-bit generating blocks C are provided to generate and further process the respective carry bits which are produced during the subtraction P−T to be carried out, where (as in the case of the first variant) P is the current counter reading of the counter, and T is the predetermined counter reading, whose reaching by the current counter reading P is to be determined (that is to say the threshold value).

The carry-bit generating blocks C in the example considered are each half-subtractor modules (half-adder modules configured for subtraction) with expanded carry-bit generation (as is usual in full-value subtractors).

Figure 7:
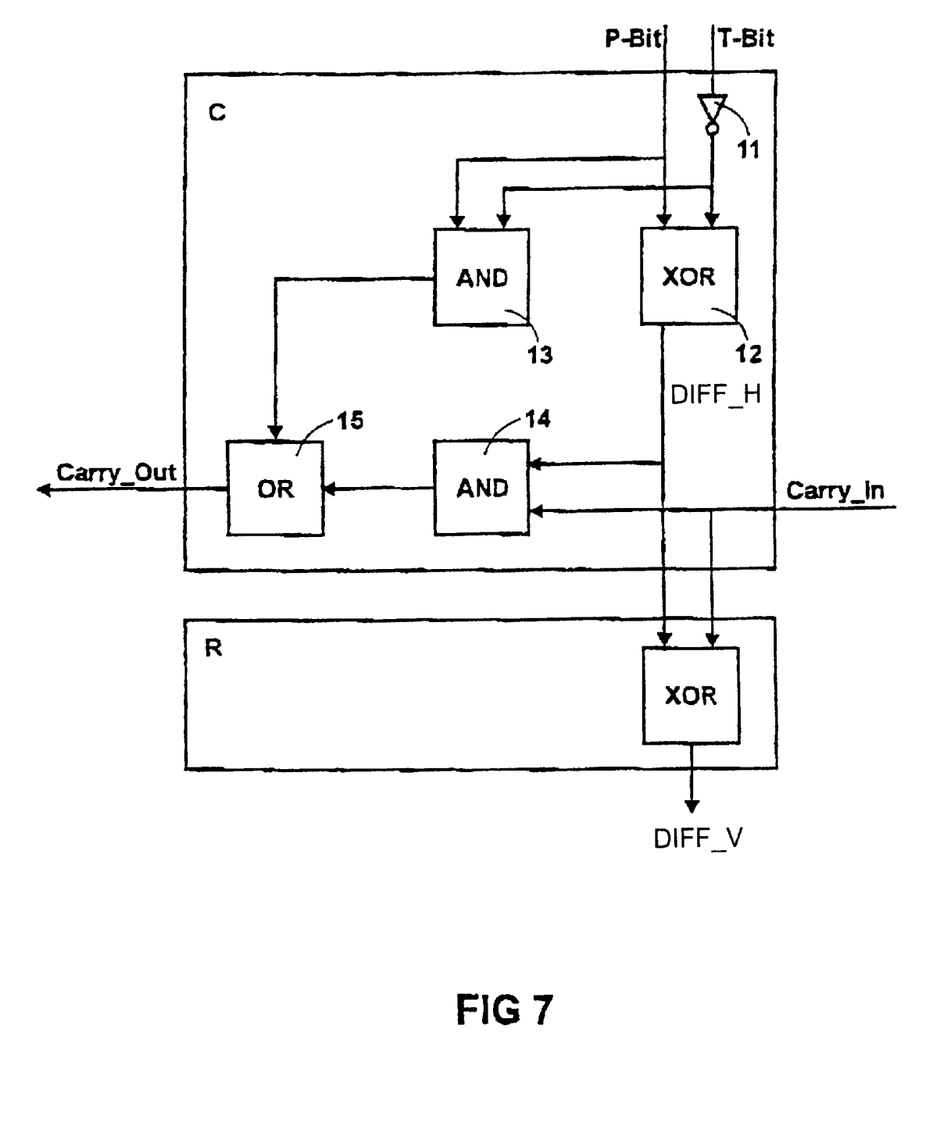
FIG. 7 is a block diagram of a carry-bit generation block and a (determination) result generation block according to FIG. 6.

As can be seen from FIG. 7, they each contain an inverter 11, an XOR element 12, a first AND element 13, a second AND element 14, and an OR element 15.

The respectively associated bit P-Bit of the counter reading P of the counter, the respectively associated bit T-Bit of the threshold value T, and a carry bit Carry_In are input to the carry-bit generating blocks C, the carry bit Carry_In being the carry bit which has been generated by the carry-bit generating block C associated with the next least significant bit of the counter readings.

The carry-bit generating block C assigned to the bit 0 of the counter readings has a value 1 input as the carry bit Carry_In—as is conventional in subtractor modules of this type.

The carry-bit generating blocks C carry out the subtraction P-bit−T-bit and, in the process, in the manner of a half-subtractor, that is to say without taking the carry bit Carry_In into account, generate a difference bit Diff_H and, in the manner of a full-value subtractor, that is to say taking the carry bit Carry_In into account, generate a carry bit Carry_Out, the difference bit Diff_H being fed to the associated result generating blocks R (if present), and the carry bit Carry_Out being output to the carry-bit generating block C associated with the next most significant bit (input into the carry-bit generating block C as the carry bit Carry_In).

The T-bit input into the carry-bit generating block C is inverted by the inverter 11.

The P-bit and the inverted T-bit are subjected to an XOR operation in the XOR element 12. The result of the XOR operation is the difference bit Diff_H already mentioned.

The P-bit and the inverted T-bit are further subjected to an AND operation in the first AND element 13. The result of the AND operation is a carry bit, which is generated by a half-subtractor in addition to the difference bit Diff_H.

The carry bit Carry_In input into the carry-bit generating block C and the difference bit Diff_H are subjected to an AND operation in the second AND element 14.

The output signal from the second AND element 14 and the output signal from the first AND element 13 are subjected to an OR operation in the OR element 15. The result of the OR operation is the carry bit Carry_Out already mentioned.

The existing result generating blocks R receive the Carry_In and Diff_H signals already mentioned above as input signals. They subject these to an XOR operation and, as a result, use the difference bit Diff_H generated without taking the carry bit Carry_In into account, that is to say the difference bit generated by a half subtractor, to generate a difference bit Diff_V generated while taking the carry bit Carry_In into account, that is to say a difference bit generated by a full-value subtractor.

For the case in which only the bits 0 to x−1 from P and T are taken into account, a difference bit Diff_V from the result generating block R associated with the bit x of the counter readings represents the sign of the result of the subtraction P−T.

If the difference bit Diff_V is equal to 0, P−T, more precisely the difference between the constituents, containing the bits 0 to x−1, of the same, is ≧0, and if the difference bit Diff_V is equal to 1, P−T, more precisely the difference between the constituents, containing the bits 0 to x−1, of the same, is <0. In the first-named case, that is to say when the difference bit Diff_V is equal to zero, the counter reading P of the counter (the constituent containing the bits 0 to x−1 of the same) has reached or passed the threshold value T (the constituent containing the bits 0 to x−1 of the same) within the time window being considered. Otherwise, that is to say when the difference bit Diff_V is equal to one, the counter reading P of the counter (the constituent containing the bits 0 to x−1 of the same) has not yet reached or passed the threshold value T (the constituent containing the bits 0 to x−1 of the same) within the time window being considered.

The output signals (the difference bits Diff_V) from all the result generating blocks R and the carry bit Carry_Out from the carry-bit generating block C associated with the most significant bits of the counter readings P and T are fed to the multiplexer MUX.

The multiplexer MUX can be controlled via a control connection SCALE. Via the control connection SCALE, it is possible to determine which of the signals applied to the multiplexer MUX are switched through. This is simultaneously a definition of the bits of the counter readings P and T to be taken into account. This is because the signals applied to the multiplexer MUX represent the signs of differences P−T formed by taking into account different numbers of bits from the counter readings P and T.

If the multiplexer MUX is driven in such a way that it switches through the difference bit Diff_V determined for bit x of the counter readings, then this defines that, during the determination as to whether the counter reading P of the counter has reached or passed the threshold value T or not, only the bits 0 to x−1 from the counter readings P and T are to be taken into account, and, with the signal RES output by the multiplexer, simultaneously receives the associated determination result.

Defining the bits to be taken into account from the counter readings P and T is simultaneously defining the magnitude of the time window to which the determination as to whether the counter reading P of the counter has reached the threshold value T or not is to be restricted.

The magnitude of the time window is preferably equal to the duration of one counting period M−m (see FIG. 1). Although upward and downward deviations require special treatment and certain restrictions, they are in principle possible.

The position of the time window in the example considered—as opposed to the configurations shown in FIGS. 3 and 5—is independent of the counter readings P and T. However, it could be changed by changing the counter parameters m and M.

The above-described second variant for configuring a configuration for determining whether the counter reading P of the counter has reached the threshold value T or not can certainly not be used quite so flexibly as the first variant, but in practical terms can be implemented with considerably less effort. The effort for the practical implementation of the second variant is only about half as great as the effort for the practical implementation of the first variant.

Irrespective of this, configurations and methods of the type described above make it possible for these to be matched individually at any time to different and even changing needs with minimum effort.

We claim:

1. A configuration for determining whether a counter reading of a counter has reached a predetermined counter reading, comprising:
   means for determining whether the predetermined counter reading has already been reached within a specific time window or not, and said means can be configured by varying one of a magnitude of the specific time window, a position of the specific time window, and a quantity of bits to be taken into account in a determination of counter readings to be compared.

2. The configuration according to claim 1, wherein the specific time window is defined relative to the predetermined counter reading.

3. The configuration according to claim 1, wherein the specific time window is defined by a first range lying before the predetermined counter reading and by a second range lying after the predetermined counter reading.

4. The configuration according to claim 1, wherein said means contains at least one memory device with a variable content for storing parameters defining the position and the magnitude of the specific time window.

5. The configuration according to claim 1, wherein said means includes a memory device with a variable content for storing the predetermined counter reading.

6. The configuration according to claim 1, wherein said means generates a determination result represented by a value based on a comparison of a difference between a current counter reading of the counter and the predetermined counter reading, and on further processing of the difference in dependence on the difference itself and on the specific time window.

7. The configuration according to claim 6, wherein the further processing of the difference consists in that, for the case in which the difference is positive or equal to zero, the magnitude of the second range lying after the predetermined counter reading is subtracted from the difference, and that for the case in which the difference is negative, the magnitude of the first range lying in front of the predetermined counter reading is added to the difference.

8. The configuration according to claim 1, wherein the bits to be taken into account in the determination of comparable counter readings are a least significant bit and a variable number of next most significant bits of the counter readings to be compared.

9. The configuration according to claim 8, wherein the counter readings to be compared are subtracted bit by bit, a generation of a respective difference bit being carried out without taking a carry bit into account, and a generation of a respective carry bit output being carried out with the carry bit being taken into account, the carry bit resulting from the subtraction of next least significant bits of the counter readings.

10. The configuration according to claim 9, wherein a difference bit formed with the carry bit being taken into account is generated for the bits of the counter readings which represent the least significant of the bits not to be taken into account from the counter readings.

11. The configuration according to claim 10, wherein the difference bit formed with the carry bit being taken into account from the least significant of the bits not to be taken into account from the counter readings is used as the determination result.

12. A method for determining whether a counter reading of a counter has reached a predetermined value, which comprises the step of:
    determining whether a predetermined counter reading has already been reached within a specific time window; and
    configuring a determination by varying at least one of a magnitude of the specific time window, a position of the specific time window, and a number bits to be taken into account of counter readings to be compared during the determination.

13. A method for determining whether a counter reading of a counter has reached a predetermined value, which comprises the step of:
    providing a device for determining whether a predetermined counter reading has already been reached within a specific time window; and
    configuring the device by at least one of varying a magnitude of the specific time window, varying a position of the specific time window, and varying bits to be taken into account of counter readings to be compared during the determining step.

14. The method according to claim 13, which comprises defining the specific time window to be taken into account relative to the predetermined counter reading.

15. The method according to claim 13, which comprises defining the specific time window to be defined by a first range lying before the predetermined counter reading and by a second range lying after the predetermined counter reading.

16. The method according to claim 13, which comprises providing the device with at least one memory device with a variable content for storing parameters defining the position and the magnitude of the specific time window.

17. The method according to claim 13, which comprises providing the device with a memory device having a variable content for storing the predetermined counter reading.

18. The method according to claim 15, which comprises forming a determination result, which is represented by a value based on a comparison of a difference between a current counter reading of the counter and the predetermined counter reading and further processing the difference in dependence on the difference itself and the specific time window.

19. The method according to claim 18, which comprises performing the further processing of the difference by, in the case in which the difference is positive or equal to zero, the magnitude of the second range is subtracted from the difference, and in the case in which the difference is negative, the magnitude of the first range is added to the difference.

20. The method according to claim 13, which comprises setting the bits to be taken into account in the determination from the counter readings to be a least significant bit and a variable number of next most significant bits of the counter readings to be compared.

21. The method according to claim 20, which comprises:
subtracting the counter readings to be compared bit by bit resulting in a generation of a respective difference bit without taking a carry bit into account; and
generating a respective carry bit output using the carry bit, the carry bit output resulting from a subtraction of next least significant bits of the counter readings.

22. The method according to claim 21, which comprises generating a difference bit formed with the carry bit being taken into account for the bits of the counter readings which can represent the least significant of the bits not to be taken into account from the counter readings.

23. The configuration according to claim 22, wherein the difference bit formed with the carry bit being taken into account from the least significant of the bits not to be taken into account from the counter readings is used as the determination result.

* * * * *

UNITED STATES PATENT AND TRADEMARK OFFICE
CERTIFICATE OF CORRECTION

PATENT NO.    : 6,459,752 B1
DATED         : October 1, 2002
INVENTOR(S)   : Peter Rohm et al.

It is certified that error appears in the above-identified patent and that said Letters Patent is hereby corrected as shown below:

<u>Title page,</u>
Item [30], should read as follows:

--       Foreign Application Priority Data

Mar. 1, 1999 (DE)   ……….. 199 08 807.1 --

Signed and Sealed this

Twenty-fourth Day of December, 2002

JAMES E. ROGAN
*Director of the United States Patent and Trademark Office*